US007358734B2

(12) United States Patent
Blümich et al.

(10) Patent No.: US 7,358,734 B2
(45) Date of Patent: Apr. 15, 2008

(54) SINGLE-SIDED NMR SENSOR WITH MICROSCOPIC DEPTH RESOLUTION

(75) Inventors: Bernhard Blümich, Roetgen (DE); Federico Casanova, Aachen (DE); Juan Perlo, Aachen (DE)

(73) Assignee: AixNMR Zentrum für Magnetische Resonanz e.V., Roetgen (DE)

( * ) Notice: Subject to any disclaimer, the term of this patent is extended or adjusted under 35 U.S.C. 154(b) by 0 days.

(21) Appl. No.: 11/399,808

(22) Filed: Apr. 7, 2006

(65) Prior Publication Data

US 2007/0182413 A1 Aug. 9, 2007

(30) Foreign Application Priority Data

Feb. 8, 2006 (DE) .............................. 20 2006 074

(51) Int. Cl.
*G01V 3/00* (2006.01)
(52) U.S. Cl. ..................................................... 324/318
(58) Field of Classification Search ......... 324/300–322
See application file for complete search history.

(56) References Cited

U.S. PATENT DOCUMENTS

| | | | | |
|---|---|---|---|---|
| 4,254,373 A * | 3/1981 | Lippmaa et al. ............. | 324/321 |
| 4,628,263 A * | 12/1986 | Kida ........................... | 324/321 |
| 4,703,276 A * | 10/1987 | Beer ........................... | 324/319 |
| 4,983,920 A * | 1/1991 | Lampman et al. .......... | 324/309 |
| 5,055,790 A * | 10/1991 | Siuciak et al. ............... | 324/309 |
| 5,221,900 A * | 6/1993 | Larson, III ................... | 324/307 |
| 5,298,864 A * | 3/1994 | Muller et al. ................ | 324/321 |
| 5,390,673 A | 2/1995 | Kikinis | |
| 5,457,387 A * | 10/1995 | Patrick et al. ............... | 324/318 |
| 5,631,616 A * | 5/1997 | Ohta et al. ................... | 335/216 |
| 5,682,047 A * | 10/1997 | Consiglio et al. ........... | 257/335 |
| 5,754,048 A * | 5/1998 | Bielecki ....................... | 324/321 |
| 5,818,319 A * | 10/1998 | Crozier et al. .............. | 335/299 |
| 5,959,454 A | 9/1999 | Westphal et al. | |
| 5,990,681 A * | 11/1999 | Richard et al. ............. | 324/318 |
| 6,084,497 A * | 7/2000 | Crozier et al. .............. | 335/299 |
| 6,118,274 A * | 9/2000 | Roffmann et al. .......... | 324/321 |
| 6,144,204 A * | 11/2000 | Sementchenko ............ | 324/318 |
| 6,163,154 A * | 12/2000 | Anderson et al. ........... | 324/320 |
| 6,169,402 B1 * | 1/2001 | Oka et al. .................... | 324/318 |
| 6,215,307 B1 * | 4/2001 | Sementchenko ............ | 324/318 |
| 6,396,271 B1 * | 5/2002 | Burl et al. ................... | 324/318 |

(Continued)

OTHER PUBLICATIONS

G. Eidmann, R. Salvelsberg, P. Blümler, and B. Blümich. The NMR-MOUSE, A Mobile Universal Surface Explorer. J. Magn. Reson. A122, 104-109 (1996).

(Continued)

*Primary Examiner*—Brij Shrivastav
*Assistant Examiner*—Dixomara Vargas
(74) *Attorney, Agent, or Firm*—Collard & Roe, P.C.

(57) ABSTRACT

A low-cost single-sided NMR sensor to produce depth profiles with microscopic spatial resolution is presented. The open geometry of the NMR sensor provides a non-invasive and non-destructive testing method to characterize the depth structure of objects of arbitrary size. The permanent magnet geometry generates one plane of constant magnetic field intensity parallel to the scanner surface. By combining the highly uniform static gradient with selective RF excitation, a thin flat sensitive slice can be defined. By moving the relative position between the slice and the object, one-dimensional profiles of the near surface of large samples are produced with high spatial resolution.

8 Claims, 4 Drawing Sheets

U.S. PATENT DOCUMENTS

| | | | |
|---|---|---|---|
| 6,404,197 B1 * | 6/2002 | Anderson et al. | 324/311 |
| 6,433,550 B1 * | 8/2002 | Kinanen | 324/320 |
| 6,441,615 B1 * | 8/2002 | Fujita et al. | 324/318 |
| 6,489,767 B1 | 12/2002 | Prado et al. | |
| 6,489,872 B1 * | 12/2002 | Fukushima et al. | 335/299 |
| 6,552,538 B2 * | 4/2003 | DeMeester et al. | 324/307 |
| 6,583,622 B1 * | 6/2003 | Hills | 324/307 |
| 6,683,456 B1 * | 1/2004 | Kinanen | 324/318 |
| 6,806,713 B2 * | 10/2004 | Wong | 324/318 |
| 6,822,447 B1 * | 11/2004 | Yamagata | 324/318 |
| 6,828,892 B1 * | 12/2004 | Fukushima et al. | 335/299 |
| 6,856,132 B2 * | 2/2005 | Appel et al. | 324/303 |
| 6,933,722 B2 * | 8/2005 | Tsuda et al. | 324/318 |
| 7,049,920 B2 * | 5/2006 | Yoshino et al. | 335/301 |
| 7,053,621 B2 * | 5/2006 | Kakugawa et al. | 324/319 |
| 7,084,633 B2 * | 8/2006 | Aoki et al. | 324/319 |

OTHER PUBLICATIONS

P. J. Prado, NMR hand-held moisture sensor, Magn. Reson. Imaging 19, 505-508 (2001).

B. Blümich, V. Anferov, S. Anferoya, M. Klein, R. Fechete, M. Adams, and F. Casanova, A. Simple NMR-MOUSE with a bar magnet, *Magn. Reson. Eng.* 15(4), 255-261, (2002).

P. J. Prado, Single sided imaging sensor, Magn. Reson. Imaging. 21, 397-400 (2003).

F. Casanova, and B. Blümich, Two-dimensional imaging with a single-sided NMR probe, J. Magn. Reson. 163, 38-45 (2003).

J. Perlo, F. Casanova, and B. Blümich, 3D imaging with a single-sided sensor: as open tomograph, J. Magn. Reson. 166, 228-235 (2004).

M.D. Hürlimann, and D.D. Griffin, Spin dynamics of Carr-Parcel-Meiboom-Gill-like sequences in grossly inhomogeneous, $B_0$ and $B_1$ fields and applications to NMR well logging, J. Magn. Reson., 143, 120-135 (2000).

P.J. McDonald, Stray field magnetic resonance imaging, Prog. Nucl. Magn. Reson. Spectrosc. 30, 69-99 (1997).

\* cited by examiner

SINGLE-SIDED NMR SENSOR WITH MICROSCOPIC DEPTH RESOLUTION

BACKGROUND OF THE INVENTION

1. Field of the Invention

The present invention relates generally to the field of magnetic resonance, specifically to a single-sided magnetic resonance imaging (MRI) sensor that provides microscopic depth resolution.

2. The Prior Art

Single-sided nuclear magnetic resonance (NMR) sensors are used to characterize large size objects by measuring signal intensity, relaxation times and self-diffusion coefficients inside a sensitive volume generated in the sample by an open magnet. G. Eidmann, R. Savelsberg, P. Blümler and B. Blümich. *The NMR-MOUSE, A Mobile Universal Surface Explorer, J. Magn. Reson.* A122, 104-109 (1996). Two different magnet philosophies can be distinguished in previous works. One is described in the U.S. Pat. No. 6,489,872 by Fukushima and references included there, where a region of a homogeneous field is generated outside the magnet. The second type is described in G. Eidmann, R. Savelsberg, P. Blümler and B. Blümich, *The NMR-MOUSE, A Mobile Universal Surface Explorer, J. Magn. Reson.* A122, 104-109 (1996), where a field with a strong gradient is tolerated. Exploiting the static field gradient inherent in the second type of geometries, volumes at different depths into the sample can be reached just by retuning the excitation frequency.

Although the procedure is similar to the high-resolution stray field imaging technique (STRAFI), the depth resolution reported with single-sided sensors is rather poor. In contrast to STRAFI, where the uniform static field gradient found in the fringe field of superconducting magnets is used to produce sample profiles with microscopic resolution, P. J. McDonald. *Stray field magnetic resonance imaging, Prog. Nucl. Magn. Reson. Spectrosc.* 30, 69-99 (1997), the field produced by the open magnets suffers from considerable lateral gradients, which define a curved sensitive slice that limit the depth resolution. Several attempts have been made to improve the flatness of the sensitive volume by tailoring the magnet geometry, but a space resolution hardly better than half a millimeter has been reported. P. J. Prado, *NMR hand-held moisture sensor, Magn. Reson. Imaging* 19, 505-508 (2001); B. Blümich, V. Anferov, S. Anferova, M. Klein, R. Fechete, M. Adams and F. Casanova, *A simple NMR-MOUSE with a bar magnet, Magn Reson. Eng.* 15 (4), 255-261 (2002); P. J. Prado, *Single sided imaging sensor, Magn. Reson. Imaging* 21, 397-400 (2003); F. Casanova and B. Blümich. *Two-dimensional imaging with a single-sided NMR probe, J. Magn. Reson.* 163, 38-45 (2003); J. Perlo, F. Casanova und B. Blümich, *3D imaging with a single-sided sensor: an open tomograph, J. Magn. Reson.* 166, 228-235 (2005).

As a result of optimization procedures, where the field profile is improved playing with the position and orientation of a large number of permanent block magnets, complicated and expensive magnet geometries are obtained. An important restriction to the optimization procedure is introduced by the requirement of a large depth range with a flat sensitive volume. This field profile has been preferred because it allows the selection of planar slices at different depths into the object just by electronically switching the tuning frequency. Nevertheless, there are strong deficiencies in this approach when the density profile is contrasted by the relaxation times or by the self-diffusion coefficient in order to improve the discrimination of heterogeneities. It is well known that the spin lattice relaxation time $T_1$ depends on the frequency, so that this type of contrast is not accessible for this scanning procedure. On the other hand, the transverse relaxation time measured by a Carr-Purcell-Meibohm-Gill (CPMG) sequence, the so-called $T_{2eff}$, is a complex mixture of the spin lattice relaxation time $T_1$ and the spin-spin relaxation time $T_2$ that strongly depends on the spatial distribution of $B_0$ and $B_1$ fields. M. D. Hürlimann and D. D. Griffin, *Spin dynamics of Carr-Purcel-Meibohm-Gill-like sequences in grossly inhomogeneous $B_0$ and $B_1$ fields and applications to NMR well logging, J. Magn. Reson.* 143, 120-135 (2000). Therefore, a systematic error in the measurement of $T_{2eff}$ due to the variation of $B_0$ and $B_1$ distribution with the depth is produced. Finally, when contrast by diffusion is required, an unwanted dependence of the profile intensity is obtained due to the change of gradient intensity with the depth.

SUMMARY OF THE INVENTION

A hand-held single-sided sensor and method for ex situ magnetic resonance profiling with microscopic resolution is provided according to the invention. In one embodiment, the sensor includes a magnet system for producing a magnetic field constant in a plane external to the body. The magnet system of this preferred embodiment includes at least four permanent magnet blocks, which may be sited on an iron yoke. All blocks are magnetized normal to the iron plate; two of them have N-S polarization while the other two have S-N polarization. Between pairs with opposite polarization there is a gap where the radio-frequency (RF) circuit is placed, while between pairs with same polarization a second gap is used to improve the magnetic field distribution. In any instance, steel pieces can be used to improve the flatness of the constant field slice.

The embodiment includes part of a NMR device through addition of a coil system for producing an oscillating magnetic field substantially transverse to the magnetic field. Another particular variation of this embodiment includes at least one shimming coil or further permanent magnet blocks to improve the flatness of the defined sensitive region. This particular field distribution combined with selective RF excitation defines one highly flat sensitive slice from where the NMR signal is detected. Thus, just by stepping the relative distance between the sample and the sensor, a microscopic resolution depth profile is obtained. Moreover, the profile can be contrasted by NMR parameters like relaxation times or self-diffusion coefficients to enhance the discrimination of heterogeneities in the sample.

In accordance with the invention the scanning procedure based on the retuning of the transmitter frequency has been discovered to adopt robust methods that involve the mechanical repositioning of either the sample or the sensor. Besides recovering the NMR contrast, this scanning procedure reduces constraints to magnet optimization. In this case, the magnet geometry must generate only one flat slice at a determined depth away from the magnet surface, so that, by tuning the sensor to the resonance frequency at this particular plane, and applying selective RF excitation, a thin flat slice is detected. The target of optimizing the slice flatness presents less constraints when only a particular depth is required instead of a large depth region. Hence, a magnet system with higher performance can be expected.

As demonstrated below, the present invention makes it possible for the first time to obtain the performance of the STRAFI method with a low-cost open NMR sensor, providing in situ microscopic profiling of samples unrestricted in size. Profiles with a resolution of about 25 µm are achieved with an extremely simple and inexpensive magnet system, which is a key factor when such tools are intended for quality control.

BRIEF DESCRIPTION OF THE DRAWINGS

Other objects and features of the present invention will become apparent from the following detailed description considered in conjunction with the accompanying drawings. It should be understood, however, that the drawings are designed for the purpose of illustration only and not as a definition of the limits of the invention.

In the drawings, wherein similar reference characters denote similar elements throughout the several views.

DETAILED DESCRIPTION OF THE PREFERRED EMBODIMENTS

Figure 1:
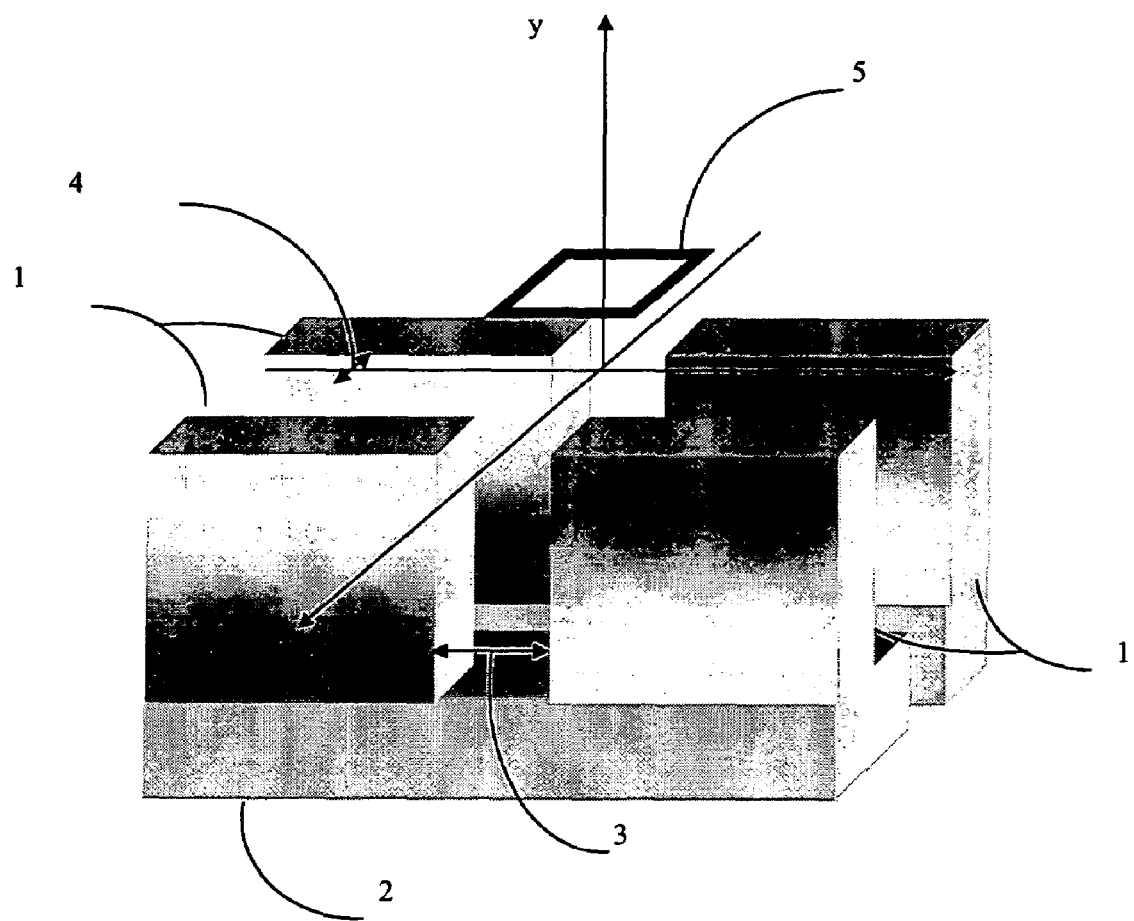
FIG. 1 is a diagram of the preferred embodiment of the sensor constructed according to an embodiment of the present invention based on 4 permanent magnet blocks.
Figure 2:
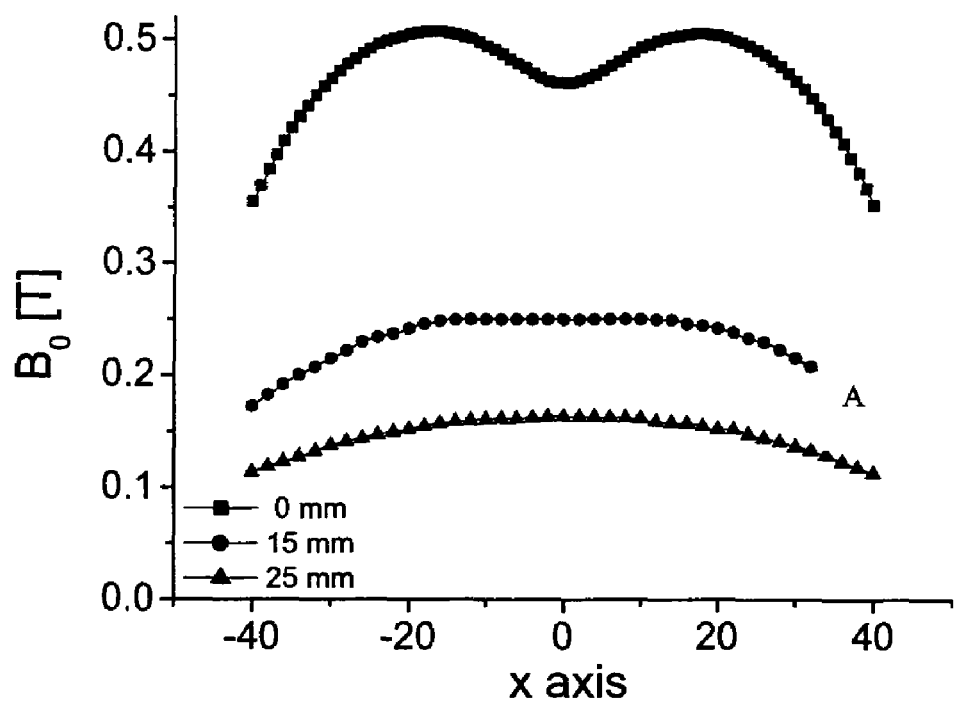
FIG. 2A shows the spatial dependence of the magnetic field intensity along the z-axis at the surface, 15 mm and 30 mm depth.
FIG. 2B shows the spatial dependence of the magnetic field intensity along the x-axis at the same depth of FIG. 2A.
Figure 2:
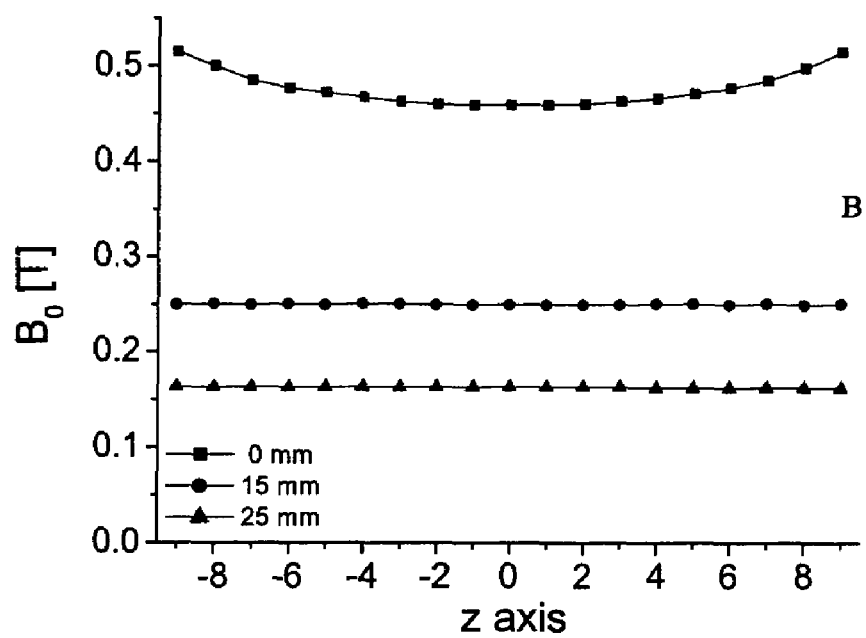

Turning to FIG. 1, the construction of a sensor prototype is presented. The magnets 1 are neodymium-iron-boron (NeFeB) blocks of 40, 50, and 45 mm along x, y and z, the gaps 3 and 4 are $G_b$=19 mm and $G_s$=4 mm respectively, and the iron yoke 2 is 20 mm thick. The magnetic field was measured using a Lakeshore Hall probe, and its spatial dependence along the two lateral directions is shown at three different depths in FIG. 2. While the behavior of the field along z is quadratic at the surface and become flat for larger depths, the field along x becomes flat at a depth of 15 mm away from the magnet, a distance that depends on the $G_s$ chosen. The magnetic field at 15 mm from the surface and in the center of the device has a value of about 0.25 T along z, and has a strong uniform gradient of 11.2 T/m along the depth direction. At this depth, the device defines a plane of constant field intensity parallel to the surface with a field variation smaller than 0.1 mT in a region of 20 mm along x and 10 mm along z. The lateral selection of a sensitive region with these dimensions will be achieved by choosing a RF coil with suitable dimensions.

The radio-frequency coil 5 in FIG. 1 and tuning circuit to be used in combination with this magnet must satisfy a number of requirements. First, the dimension of the coil is determined by the lateral dimensions of the sensitive region where the magnet system defines a flat slice. For the present prototype, this region is smaller than 20×10 mm$^2$ in the x-z plane. Second, the coil must have a low inductance to reduce the detuning generated during the scanning procedure, which involves the movement of the sensor with respect to the object and can change the load of the coil. Third, the maximum depth desired determines the distance at which the coil must be positioned away from the magnet surface.

The RF coil used to fulfil these requirements is a two-turn rectangular coil wound with copper wire 1.75 mm diameter. It has a length of 15 mm along x and 19 mm along z and defines a sensitive region 15 mm and 10 mm long respectively. This region is relatively small along z compared with x because the RF field becomes parallel to the static field at the z-border of the coil. For demonstration purpose, the coil was positioned at 9 mm above the magnet surface to define a maximum depth reachable into the object, of field-of view (FoV) for the depth profile, of 6 mm. The intensity of RF field at 6 mm depth is half of the value at surface.

A parallel tank-circuit is used for tuning and matching of the RF coil. Its low inductance of about 0.12 µH requires 2000 pF to be tuned at 10.6 MHz. The nominal quality factor (Q) of the circuit is 65, which leads to a dead time of about 25 µs. By introducing a resistance in parallel to the coil, the Q factor of the circuit can be reduced to lower the dead time. For this coil, for example, and a resistance of 270Ω, the Q is reduced to 18, so a dead time of about 7 µs can be achieved. To test the change in the tuning and matching conditions, different samples like polymers, liquids like water and oil, biological samples, and rocks were placed on top of the RF coils, obtaining a maximum shift in the resonance frequency of 5 kHz, 30 times smaller than the circuit bandwidth, and a negligible change from −40 dB to −37 dB in the reflected power.

Figure 3:
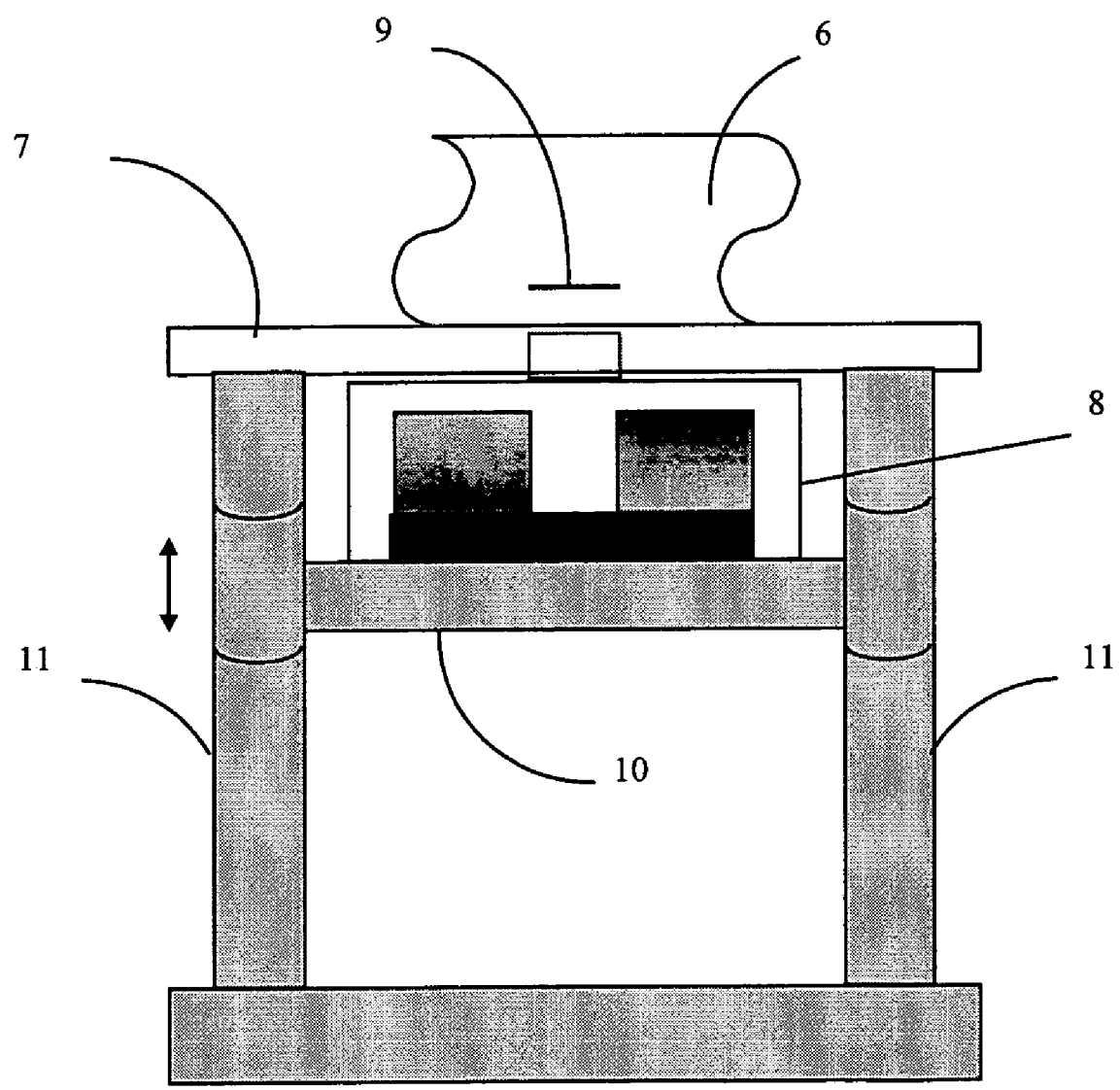
FIG. 3 is a schematic view of the sensor positioned on the lift required for scanning the object as a function of the depth with high spatial precision.

The setup including the lift to position the sensitive slice at the desired depth in the object is shown in FIG. 3. The sample under study 6 is positioned on top of a flat holder 7 and the NMR sensor 8 generating the sensitive slice 9 is placed under it on a horizontal plate 10 which position can be controlled by a high-precision screw 11. The mechanism has a precision of 10 µm to step the sensor in a range of 50 mm.

Figure 4:
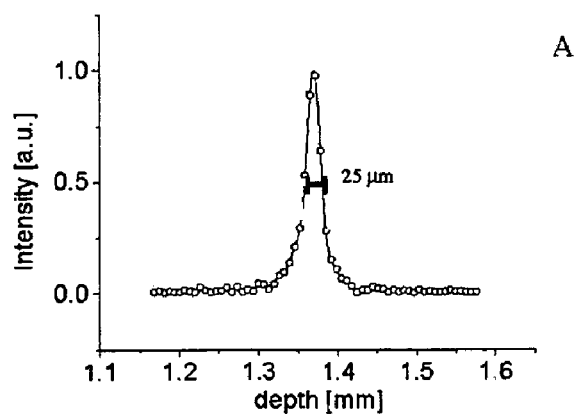
FIG. 4A shows the width of the exited slice scanned using a very thin sample. The linewidth of 25 micrometer proves that the design provides high depth resolution.
FIG. 4B is a one-dimensional profile of two rubber sheets 0.5 mm thickness separated by a 0.15 mm glass. The high resolution offered by the scanner is apparent, and can be estimated from the edges of the sample.
FIG. 4C is a one-dimensional profile of a sandwich of rubber sheets (R) and glasses (G) with different thickness that shows the performance of the scanning procedure along the FoV, which for this example was set to 6 mm. The sample is made up of G-R-G-R-G-R-G with thickness 1-1-0.5-1-1-0.5-1 millimeters.
Figure 4:
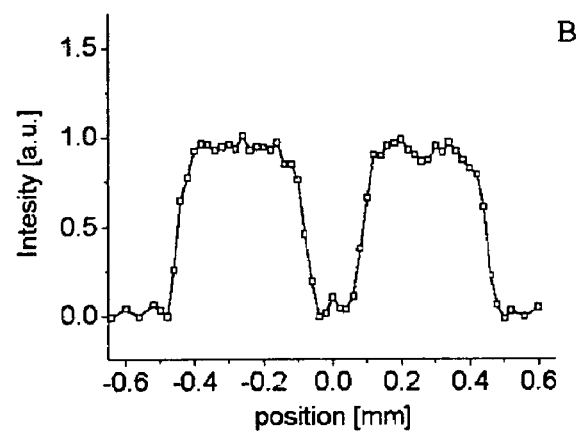
Figure 4:
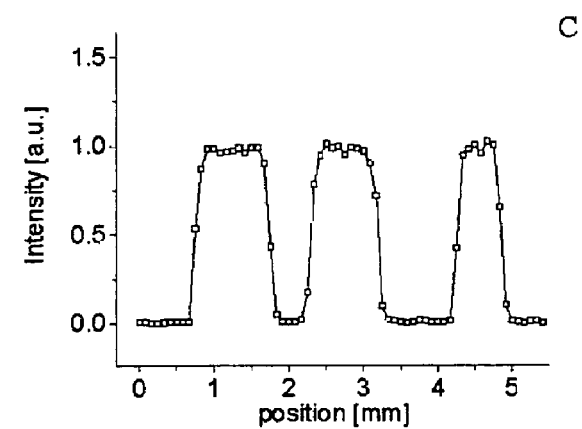

To measure the thickness of the slice, a thin oil film pressed between two glass plates was centered with the sensitive slice and imaged using the static gradient. The RF pulse length was set to 5 µs to completely excite the sample. FIG. 4A shows the Fourier transform of the echo signal acquired in the presence of the static gradient. The 1D profile of the oil film is a thin line 25 µm width. No reduction in the line width was observed when reducing the film thickness, which means the minimum linewidth of 25 µm is the maximum resolution achieved with this prototype.

To illustrate the performance of the scanning method, a phantom sample was made up as a sandwich of two rubber sheets 0.5 mm thick separated by a 0.15 mm glass plate (FIG. 4B). The sample was scanned moving the lift in steps of 20 µm. The high resolution can be appreciated from the sharp edges of each rubber sheet. FIG. 4C shows the profile of a sandwich of glasses and rubber layers with a thickness specified in the figure. The total object is 6 mm thick and shows how good the method works along the FoV. For this particular case, the RF coil was placed to define a FoV of 6 mm but it can be adjusted to the desired value just by changing the relative position between the coil and the magnet surface.

Besides improving the space resolution, the flatness of the sensitive volume presents two further advantages. First, no background signals are obtained from the housing of the RF coil as a consequence of a possible intersection of a curved sensitive volume, and second, a sensitivity improvement is expected for thin samples because the effective intersection between the sample and the sensitive volume would be larger.

Although at least one embodiment has been shown and described, it is to be understood that many changes and modifications may be made thereunto without departing from the spirit and scope of the invention as defined in the appended claims.

What is claimed is:

1. A unilateral magnetic resonance sensor for scanning sample depth profiles with microscopic resolution of an arbitrarily large object by placing the sensor on one side of the object without requiring pulsed direct current field gradients comprising:
   (a) an array of magnets having a magnet geometry generating a magnetic field in a region external to the magnet array varying linearly with distance from a surface of the magnet array; and
   (b) a flat coil generating a radio-frequency field in the region external to the magnet array for exciting and detecting an NMR signal from a flat slice parallel to the surface of the magnet array.

2. The sensor of claim 1 further comprising a flat gradient coil system positioned between the magnet array and the radio-frequency coil for generation of lateral gradient fields in the region external to the magnet array where the flat slice is defined.

3. An apparatus comprising:
   (a) a unilateral magnetic resonance sensor for scanning sample depth profiles with microscopic resolution of an arbitrarily large object by placing the sensor on one side of the object without requiring pulsed direct current field gradients comprising an array of magnets having a magnet geometry generating a magnetic field in a region external to the magnet array varying linearly with distance from a surface of the magnet array, and a flat coil generating a radio-frequency field in the region external to the magnet array for exciting and detecting an NMR signal from a flat slice parallel to the surface of the magnet array; and
   (b) a mechanical device for varying distance of the sample with respect to the sensor in order to sweep a position of a sensitive slice inside the sample.

4. A method of single-sided nuclear magnetic resonance imaging of an arbitrarily large object placed in a region external to a sensor comprising the steps of:
   (a) placing an object on top of a holder;
   (b) generating a magnetic field with a uniform gradient in the region external to the sensor, the sensor comprising a unilateral magnetic resonance sensor comprising an array of magnets having a magnet geometry generating a magnetic field in the region external to the sensor varying linearly with distance from a surface of the magnet array;
   (c) positioning an area of the uniform magnetic field gradient at a volume of interest inside the sample;
   (d) producing at least one radio-frequency field component approximately transverse to the magnetic field via a flat radio-frequency coil;
   (e) measuring an electromagnetic response from the volume of interest; and
   (f) varying sensor position with respect to the object via a mechanical device and repeating steps (b)-(e) in order to measure an NMR signal of consecutive slices to produce a profile of a sample of the object.

5. A unilateral magnetic resonance sensor for scanning depth profiles with microscopic resolution of an arbitrarily large object by placing the sensor on one side of the object without requiring pulsed direct current field gradients comprising:
   (a) a magnet geometry comprising at least four permanent magnet blocks positioned on an iron yoke separated by first and second perpendicular gaps and forming a magnet surface, the magnet blocks separated by the first gap being polarized along opposite directions and the magnet blocks separated by the second gap being polarized along a same direction, the magnet blocks being arranged and dimensioned to generate a magnetic field in a region external to the magnet blocks varying linearly with distance from the magnet surface; and
   (b) a flat coil generating a radio-frequency field in the region external to the magnet blocks for exciting and detecting an NMR signal from a flat slice parallel to the magnet surface.

6. The sensor of claim 5 further comprising a flat gradient coil system positioned between the magnet blocks and the radio-frequency coil for generation of lateral gradient fields in the region external to the magnet blocks where the flat slice is defined.

7. An apparatus comprising:
   (a) a unilateral magnetic resonance sensor for scanning sample depth profiles with microscopic resolution of an arbitrarily large object by placing the sensor on one side of the object without requiring pulsed direct current field gradients comprising a magnet geometry comprising at least four permanent magnet blocks positioned on an iron yoke separated by first and second perpendicular gaps and forming a magnet surface, the magnet blocks separated by the first gap being polarized along opposite directions and the magnet blocks separated by the second gap being polarized along a same direction, the magnet blocks being arranged and dimensioned to generate a magnetic field in a region external to the magnet blocks varying linearly with distance from the magnet surface, and a flat coil generating a radio-frequency field in the region external to the magnet blocks for exciting and detecting an NMR signal from a flat slice parallel to the magnet surface; and
   (b) a mechanical device for varying distance of the sample with respect to the sensor in order to sweep a position of a sensitive slice inside the sample.

8. A method of single-sided nuclear magnetic resonance imaging of an arbitrarily large object placed in a region external to a sensor comprising the steps of:
   (a) placing an object on top of a holder;
   (b) generating a magnetic field with a uniform gradient in the region external to the sensor, the sensor comprising a unilateral magnetic resonance sensor comprising a magnet geometry comprising at least four permanent magnet blocks positioned on an iron yoke separated by first and second perpendicular gaps and forming a magnet surface, the magnet blocks separated by the first gap being polarized along opposite directions and the magnet blocks separated by the second gap being polarized along a same direction, the magnet blocks being arranged and dimensioned to generate a magnetic field in a region external to the magnet blocks varying linearly with distance from the magnet surface;

(c) positioning an area of the uniform magnetic field gradient at a volume of interest inside the sample;
(d) producing at least one radio-frequency field component approximately transverse to the magnetic field via a flat radio-frequency coil;
(e) measuring an electromagnetic response from the volume of interest; and
(f) varying sensor position with respect to the object via a mechanical device and repeating steps (b)-(e) in order to measure an NMR signal of consecutive slices to produce a profile of a sample of the object.

* * * * *

UNITED STATES PATENT AND TRADEMARK OFFICE
CERTIFICATE OF CORRECTION

PATENT NO.         : 7,358,734 B2                                           Page 1 of 1
APPLICATION NO.    : 11/399808
DATED              : April 15, 2008
INVENTOR(S)        : Blümich et al.

It is certified that error appears in the above-identified patent and that said Letters Patent is hereby corrected as shown below:

In particular, title page, item (30), please change the Claim of Priority of the Foreign Application Priority data to correctly read as follows:

-- Feb. 8, 2006  (DE) ..................... 20 2006 002 074.8 --.

Signed and Sealed this

Eighth Day of July, 2008

JON W. DUDAS
*Director of the United States Patent and Trademark Office*